United States Patent
Peng

(10) Patent No.: US 10,367,328 B2
(45) Date of Patent: Jul. 30, 2019

(54) PULSE LASER DEVICE

(71) Applicant: Industrial Technology Research Institute, Hsinchu (TW)

(72) Inventor: Jin-Long Peng, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/643,456

(22) Filed: Jul. 6, 2017

(65) Prior Publication Data

US 2019/0013639 A1    Jan. 10, 2019

(51) Int. Cl.

| H01S 3/11 | (2006.01) |
|---|---|
| H01S 3/067 | (2006.01) |
| H01S 3/08 | (2006.01) |
| H01S 5/50 | (2006.01) |

(52) U.S. Cl.
CPC ........ *H01S 3/1118* (2013.01); *H01S 3/06712* (2013.01); *H01S 3/06791* (2013.01); *H01S 3/08054* (2013.01); *H01S 3/1112* (2013.01); *H01S 5/5009* (2013.01)

(58) Field of Classification Search
CPC .............. H01S 3/1118; H01S 3/08054; H01S 3/06791; H01S 3/06712; H01S 3/1112; H01S 5/5009
See application file for complete search history.

(56) References Cited

U.S. PATENT DOCUMENTS

| 5,050,183 A | 9/1991 | Duling, III |
|---|---|---|
| 5,448,657 A * | 9/1995 | Kim .............. G01D 5/344 |
|  |  | 372/6 |
| 5,513,194 A | 4/1996 | Tamura et al. |
| 5,617,434 A | 4/1997 | Tamura et al. |

(Continued)

FOREIGN PATENT DOCUMENTS

| CN | 101611522 | 4/2013 |
|---|---|---|
| KR | 20120058275 | 6/2012 |

(Continued)

OTHER PUBLICATIONS

Wang et al., "Cross-splicing method for compensating fiber birefringence in polarization-maintaining fiber ring laser mode locked by nonlinear polarization evolution," Applied Optics, Jul. 20, 2016, pp. 5766-5770.

(Continued)

*Primary Examiner* — Xinning(Tom) Niu
(74) *Attorney, Agent, or Firm* — JCIPRNET

(57) ABSTRACT

A laser device with a ring laser resonator includes a polarization maintaining (PM) fiber, a first quarter waveplate, and an optical isolator. The PM fiber has a light input end and a light output end and is configured to guide a first linearly polarized light with a first phase along a fast axis of the PM fiber from the light input end and a second linearly polarized light with a second phase along a slow axis of the PM fiber from the input end. The first quarter waveplate is disposed at the light output end of the PM fiber and configured to (Continued)

convert the first and the second linearly polarized lights into left-handed and right-handed (or right-handed and left-handed) circularly polarized lights, respectively. The optical isolator is configured to unidirectionally transmit a laser pulse in the ring laser resonator.

13 Claims, 7 Drawing Sheets

(56) References Cited

U.S. PATENT DOCUMENTS

| | | | |
|---|---|---|---|
| 5,689,519 | A | 11/1997 | Fermann et al. |
| 5,923,686 | A | 7/1999 | Fermann et al. |
| 6,636,674 | B2 | 10/2003 | Kim et al. |
| 7,251,258 | B2 | 7/2007 | Wise et al. |
| 7,817,684 | B2 | 10/2010 | Nicholson |
| 7,940,816 | B2 | 5/2011 | Nicholson |
| 8,494,014 | B2 | 7/2013 | Aguergaray |
| 8,873,601 | B2 | 10/2014 | Haensel et al. |
| 8,908,721 | B2 | 12/2014 | Yoon et al. |
| 9,276,372 | B2 | 3/2016 | Haensel et al. |
| 2004/0114641 | A1* | 6/2004 | Wise ............ H01S 3/06791 372/6 |
| 2009/0323735 | A1* | 12/2009 | Kuksenkov ........ G02B 6/03627 372/6 |
| 2010/0067923 | A1* | 3/2010 | Arahira ............ H04B 10/5561 398/188 |
| 2014/0153084 | A1* | 6/2014 | Papadopoulos ......... H01S 3/005 359/341.1 |

FOREIGN PATENT DOCUMENTS

| | | |
|---|---|---|
| TW | I509923 | 11/2015 |
| WO | 2015064957 | 5/2015 |

OTHER PUBLICATIONS

Szczepanek et al., "Ultrafast laser mode-locked using nonlinear polarization evolution in polarization maintaining fibers," Optics Letters, Feb. 1, 2017, pp. 575-578.

Matsas et al., "Selfstarting passively mode-locked fibre ring soliton laser exploiting nonlinear polarisation rotation," Electronics Letters, Jul. 16, 1992, pp. 1391-1393.

Fermann et al., "Environmentally stable Kerr-type mode-locked erbium fiber laser producing 360-fs pulses," Optics Letters, Jan. 1, 1994, pp. 43-45.

Stolen et al., "Intensity discrimination of optical pulses with birefringent fibers," Optics Letters, Oct. 1982, pp. 512-514.

Aguergaray et al., "Mode-locked femtosecond all-normal all-PM Yb-doped fiber laser using a nonlinear amplifying loop mirror," Optics Express, Apr. 23, 2012, pp. 10545-10551.

Hofer et al., "Mode locking with cross-phase and self-phase modulation," Optics Letters, Apr. 1, 1991, pp. 502-504.

Nielsen et al., "All-fiber mode-locked fiber laser," Optics Letters, Jun. 1, 2007, pp. 1474-1476.

Tamura et al., "Self-starting additive pulse mode-locked erbium fibre ring laser," Electronics Letters, Nov. 19, 1992, pp. 2226-2228.

"Search Report of Europe Counterpart Application", dated Dec. 14, 2018, p. 1-p. 5.

* cited by examiner

PULSE LASER DEVICE

TECHNICAL FIELD

The technical field relates to a pulse laser device.

BACKGROUND

Mode-locked ultra-short pulse fiber laser has many applications, such as micro machining, laser surgical operation, optical frequency measurement, etc. Nonlinear polarization rotation (NPR) has been used as an artificial saturable absorber in a fiber ring laser to start the mode-locking for many years. Traditionally, NPR mode-locked fiber ring laser requires the polarization of the laser to be elliptical at the input end of the fiber and nonlinear phase generated in the fiber makes the polarization ellipse rotate. To allow the polarization ellipse to rotate along the fiber, usually non-polarization-maintaining (non-PM) single mode fiber is used. The refraction index of non-PM single mode fiber can be changed by environmental temperature or pressure variation, thus, the polarization state of the laser light in the laser resonator can be changed and mode-locking may fail. Therefore, an environmental stable mode-locked fiber laser is urgent for reliably operating the ultra-short pulse fiber laser.

SUMMARY

A pulse laser device with a ring laser resonator is introduced herein. The laser device includes a polarization maintaining (PM) fiber, a first quarter waveplate, and an optical isolator in the ring laser resonator. The PM fiber has a light input end and a light output end and is configured to guide a first linearly polarized light with a first phase along a fast axis of the PM fiber from the light input end and a second linearly polarized light with a second phase along a slow axis of the PM fiber from the input end. The first quarter waveplate is disposed at the light output end of the PM fiber and configured to convert the first and the second linearly polarized lights into left-handed and right-handed (or right-handed and left-handed) circularly polarized lights, respectively. The optical isolator is configured to unidirectionally transmit a laser pulse in the ring laser resonator. The PM fiber has at least one 90 degrees cross splicing position to eliminate delay between the first linearly polarized light and the second linearly polarized light. The PM fiber, the first quarter waveplate, and the optical isolator are on a light path of the ring laser resonator.

A pulse laser device with a ring laser resonator is introduced herein. The laser device includes a polarization maintaining (PM) fiber, an optical isolator, a delay tuner and a first quarter waveplate in the ring laser resonator. The PM fiber has a light input end and a light output end and is configured to guide a first linearly polarized light with a first phase along a fast axis of the PM fiber from the light input end and a second linearly polarized light with a second phase along a slow axis of the PM fiber from the input end. The optical isolator is configured to unidirectionally transmit a laser pulse in the ring laser resonator. The delay tuner is configured to eliminate delay between the first linearly polarized light and the second linearly polarized light from or to the fast axis and the slow axis of the PM fiber. The first quarter waveplate is disposed at the light output end of the PM fiber and configured to convert the first and the second linearly polarized lights into left-handed and right-handed (or right-handed and left-handed) circularly polarized lights, respectively. The PM fiber, the optical isolator, and the delay tuner are on a light path of the ring laser resonator.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
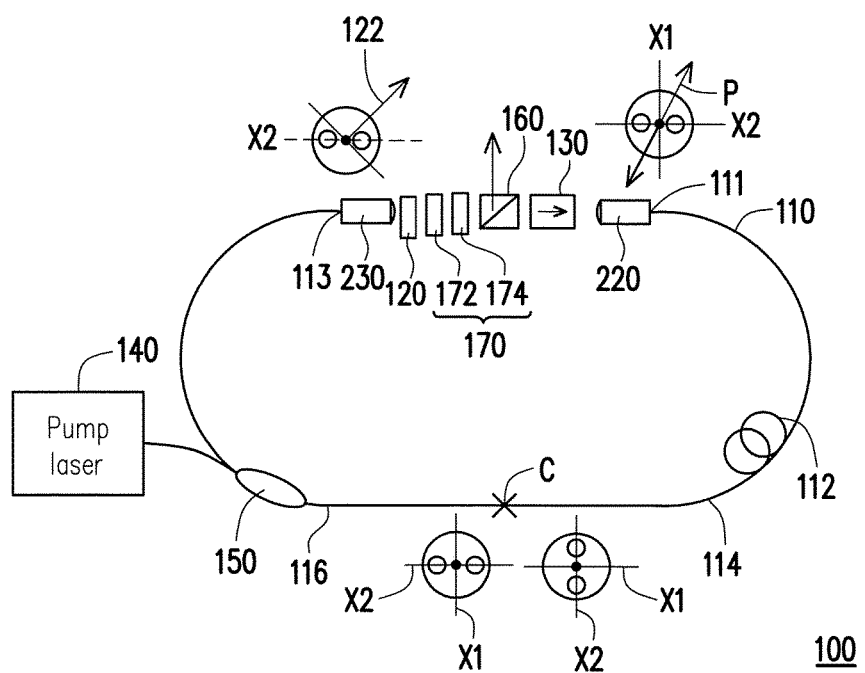
FIG. 1 is a schematic view of a pulse laser device according to an exemplary embodiment.

FIG. 1 is a schematic view of a pulse laser device according to an exemplary embodiment. Referring to FIG. 1, the laser device 100 with a ring laser resonator in this embodiment includes a polarization maintaining (PM) fiber 110, a first quarter waveplate 120, and an optical isolator 130 in the ring laser resonator. In this embodiment, the PM fiber 110 includes a PM gain fiber section 112, which may be at least one of a section of Erbium, Ytterbium, or Thulium-doped fiber and a Raman or Brillouin gain medium. The pulse laser device further includes a pump laser 140 and a wavelength-division multiplexer (WDM) 150, and the PM gain fiber section 112 is pumped by the pump laser 140 through the wavelength-division multiplexer 150. The pump laser 140 is, for example, a diode laser, a semiconductor laser, a solid state laser, a continuous wave fiber laser, or any other type of laser. For example, the pump laser 140 emits a light having a wavelength of 980 nm, which is transmitted to the PM gain fiber section 112 through the WDM 150. The PM gain fiber section 112 absorbs the light having the wavelength of 980 nm, and generates a light having the wavelength of 1550 nm, for example. The PM fiber 110, the first quarter waveplate 120, the optical isolator 130, and the WDM 150 are on a light path of the ring laser resonator (i.e. the ring shown in FIG. 1), and the optical isolator 130 is configured to unidirectionally transmit the light having the wavelength of 1550 nm, and ensure a single direction of lasing. For example, the optical isolator 130 makes the light having the wavelength of 1550 nm travel clockwise in FIG. 1 in the ring laser resonator.

The PM fiber 110 has a light input end 111 and a light output end 113. A collimator 220 and a collimator 230 are respectively disposed on the light input end 111 and the light output end 113. In addition, the pulse laser device 100 in this embodiment further includes an output coupling device 160 disposed on the light path of the ring laser resonator. The output coupling device 160 includes at least one of a polarizing beam splitter (PBS) and a fiber coupler. In this embodiment, the output coupling device 160 is a PBS, and the optical isolator 130 may be a polarization sensitive isolator or a polarization insensitive isolator. In other embodiments, if the output coupling device 160 is a fiber coupler and no PBS is used as an output coupling device, the optical isolator 130 is a polarization sensitive isolator.

After the light having the wavelength 1550 nm passes through the coupling device 160 and the optical isolator 130, the light having the wavelength 1550 nm has a polarization direction P tilted with respect to the fast axis X1 (parallel to the y-direction in FIG. 2A) and the slow axis X2 (parallel to the x-direction in FIG. 2A) of the PM fiber 110. The x-direction is perpendicular to the y-direction. The light having the wavelength of 1550 nm and having the polarization direction P may be deemed a combination of a first linearly polarized light having a polarization direction P1 parallel to the fast axis X1 and a second linearly polarized light having a polarization direction P2 parallel to the slow axis X2. Moreover, the optical isolator 130 is configured to unidirectionally transmit a laser pulse in the reasonator. The light having the wavelength of 980 nm and the light having the wavelength of 1550 nm are taken as an example, but the disclosure is not limited thereto. By adopting another type of pump laser 140, it may provide a pumping light with a wavelength other than 980 nm, and by adopting another type of gain medium, it may generate a light with a wavelength other than 1550 nm.

The PM fiber 110 is configured to guide the first linearly polarized light with a first phase along the fast axis X1 of the PM fiber 110 from the light input end 111 and a second linearly polarized light with a second phase along a slow axis X2 of the PM fiber 110 from the input end 111. In this embodiment, the first phase is the same as the second phase. However, in other embodiments, the first phase is different from the second phase.

Figure 2A:
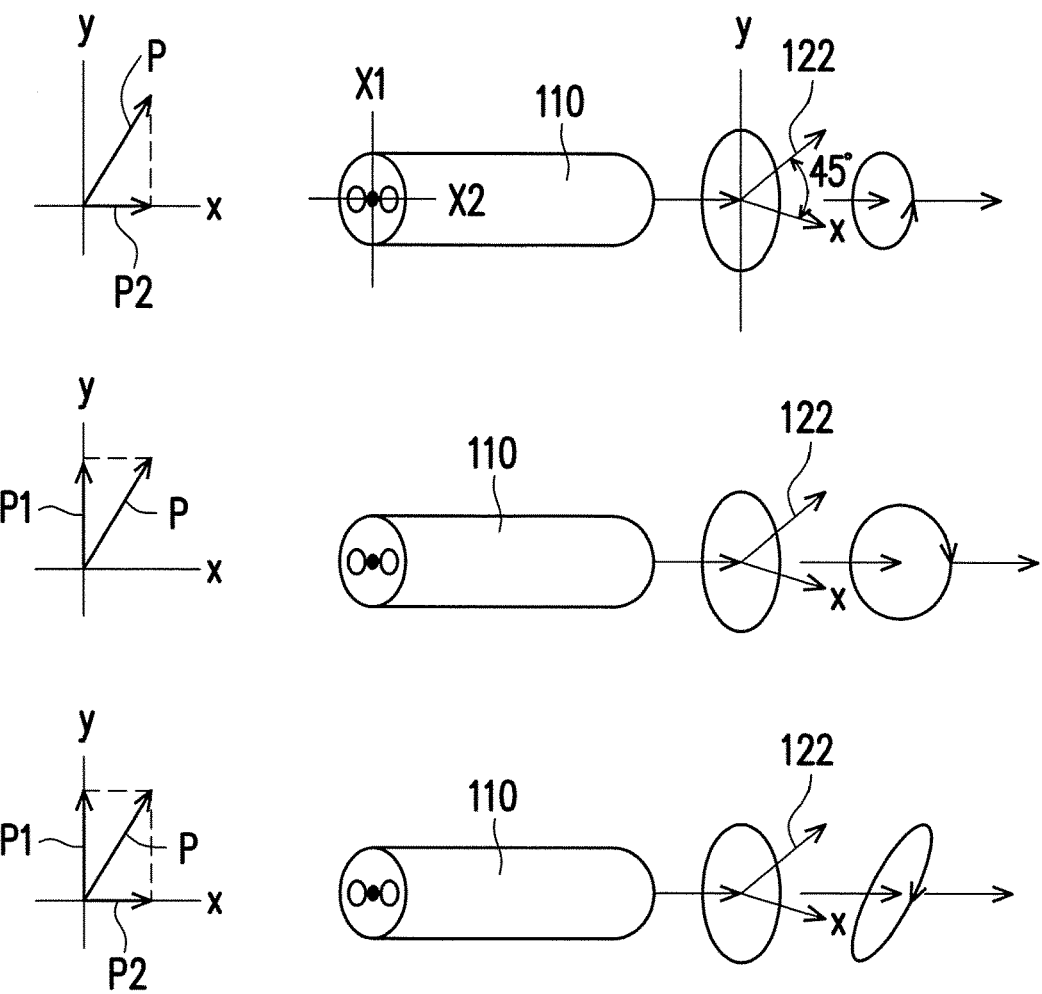
FIG. 2A shows polarization states of the first linearly polarized light, the second linearly polarized light, and the combination thereof before and after passing through the combination of the PM fiber and the first quarter waveplate in FIG. 1.
Figure 2B:
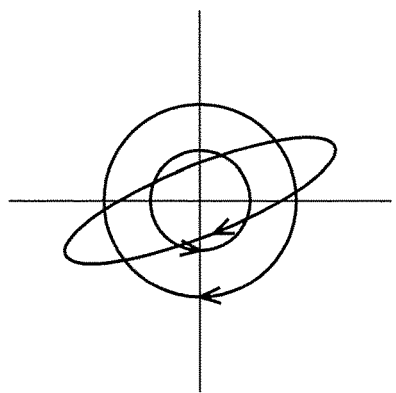
FIG. 2B shows that the left-handed and right-handed circularly polarized lights after the first quarter waveplate in FIG. 1 combine into an elliptically polarized light.

The first quarter waveplate 120 is disposed at the light output end 113 of the PM fiber 110 and configured to convert the first and the second linearly polarized lights into left-handed and right-handed (or right-handed and left-handed) circularly polarized lights, respectively. A linear phase difference and a nonlinear phase difference between the two pulses propagating along the fast axis X1 and the slow axis X2 become the phase difference between the two circularly polarized lights after the first quarter waveplate 120. In this embodiment, the amplitude of the first linearly polarized light is different from that of the second linearly polarized light, so that the amplitude of the left-handed circularly polarized light is different from that of the right-handed circularly polarized light. As a result, the left-handed circularly polarized light and the right-handed circularly polarized light combine into an elliptically polarized light with a laser field polarization ellipse having the principal axis angle dependent on the linear and nonlinear phase difference, as shown in FIGS. 2A and 2B. In this embodiment, the first quarter waveplate 120 has an optical axis 122 tilted with respect to the fast axis X1 and the slow axis X2 of the PM fiber 110 by 45 degrees.

The PM fiber 110 has at least one 90 degrees cross splicing position C to eliminate the delay between the first linearly polarized light and the second linearly polarized light. Specifically, for example, the PM fiber 110 includes a section 114 and a section 116 spliced together at the 90 degrees cross splicing position C, and the fast axis of the section 114 is aligned and parallel with the slow axis of the section 116, and the slow axis of the section 114 is aligned and parallel with the fast axis of the section 116. As a result, the pulse of the first linearly polarized light from the light input end 111 and the pulse of the second linearly polarized light from the light input end 111 may simultaneously reach the light output end 113.

In this embodiment, the pulse laser device 100 is a mode-locked fiber ring laser with all PM fiber 110 based on nonlinear polarization rotation (NPR) mechanism. The NPR mechanism happens from the combination of inputting linearly polarized light into the PM fiber 110 with the polarization axis P tilted with respect to the slow axis X2 and the fast axis X1 of the PM fiber 110 and a first quarter waveplate 120 mounted after the PM fiber 110 with the optical axis 122 tilted 45° from the fast axis X1 and the slow axis X2 of the PM fiber 110. The first quarter waveplate 120 transforms the two linearly polarized lights from the fast and the slow axes X1 and X2 into left- and right-handed circularly polarized lights respectively. The superposition of the two circularly polarized is elliptically polarized light with the angle of the principal axis depending on the nonlinear phase difference of the two light fields obtained in the fast and slow axes X1 and X2 of the PM fiber. This mimics the NPR effect in a conventional NPR mode-locked fiber laser constructed with non-PM fiber. Different from a conventional NPR mode-locked fiber laser, in this embodiment, the laser field polarization ellipse is formed and rotates after the combination of the PM fiber 110 and the first quarter waveplate 120, not along the fiber. The PM fiber 110 maintains the polarizations of the two linearly polarized lights along the fast and slow axes X1 and X2 to reduce the effect of environmental variations, e.g. temperature and pressure variations. As a result, an environmental stable mode-locked fiber laser, i.e. the pulse laser device 100, is achieved.

Figure 3:
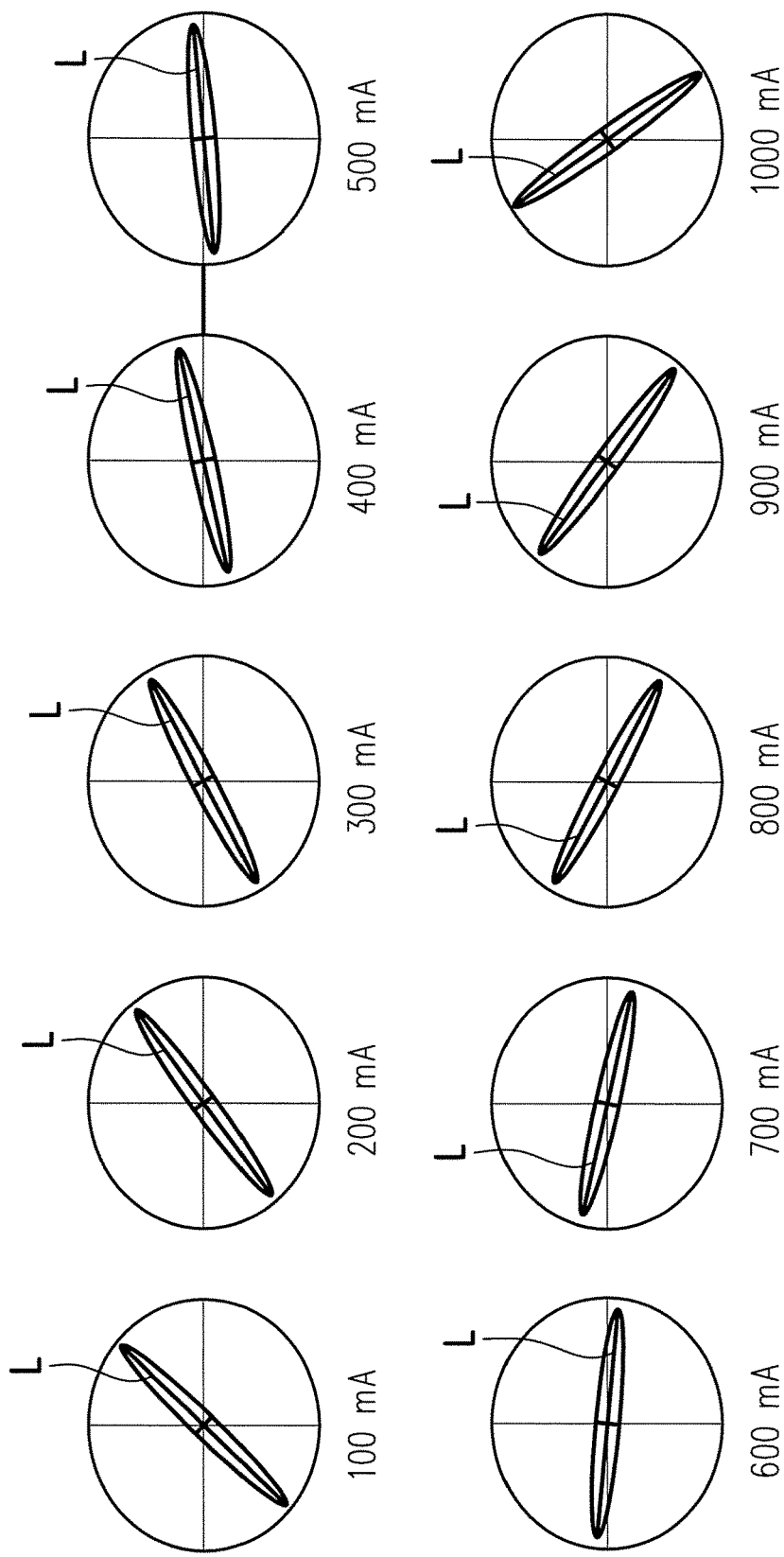
FIG. 3 shows the rotation of the principal axis L of the laser field polarization ellipse in FIGS. 2A and 2B with the change of the pump current applied to the pump laser in FIG. 1 when an external pulse is injected into the PM fiber.

In addition, due to Kerr effect, when the pump current of the pump laser 140 is changed (e.g. changed to 100 mA, 200 mA, 300 mA, 400 mA, 500 mA, 600 mA, 700 mA, 800 mA, 900 mA, and 1000 mA), the principal axis L of the laser field polarization ellipse after the first quarter waveplate 120 rotates as shown in FIG. 3, but the shape of the ellipse is not changed. The output coupling device 160 (i.e. a PBS) allows light with high intensity to pass through and reflects light with lower intensity, which facilitates the generation of mode-locking. After the mode-locking is started, the reflected light with lower intensity forms an output pulse laser beam. In other embodiments, an additional fiber coupler may also be spliced in the ring laser resonator to output another pulse laser beam.

In this embodiment, the pulse laser device 100 further includes a polarization controlling device 170 disposed on the light path of the ring laser resonator between the first quarter waveplate 120 and the optical isolator 130. The polarization controlling device 170 may include a half waveplate 172, a second quarter waveplate 174, or a combination thereof. In this embodiment, the polarization controlling device 170 includes the half waveplate 172 and the second quarter waveplate 174. The optical axes of the half waveplate 172 and the second quarter waveplate 174 may be rotated to appropriate directions to allow high intensity light to pass through the output coupling device 160 (i.e. the PBS), compensate a residual linear phase difference, and facilitate the generation of mode-locking. In this embodiment, the half waveplate 172 is disposed between the first quarter waveplate 120 and the second quarter waveplate 174. However, in other embodiments, the position of the half waveplate 172 and the position of the second quarter waveplate 174 may be interchanged; that is, the second quarter waveplate 174 may be disposed between the first quarter waveplate 120 and the half waveplate 172.

Moreover, in another embodiment, at least one of a half waveplate and an other retardation waveplate (i.e. a waveplate having retardation different from half a wavelength, i.e., different from the retardation of a half waveplate), e.g. a quarter waveplate, may be disposed on the light path of the ring laser resonator and at the light input end 111 of the PM fiber 110 to adjust the light field amplitude inputted to the fast and slow axes X1 and X2 of the PM fiber 110. If the other retardation waveplate is disposed, the first phase of the first linearly polarized light at the light input end 111 is different from the second phase of the second linearly polarized light at the light input end 111.

Figure 4:
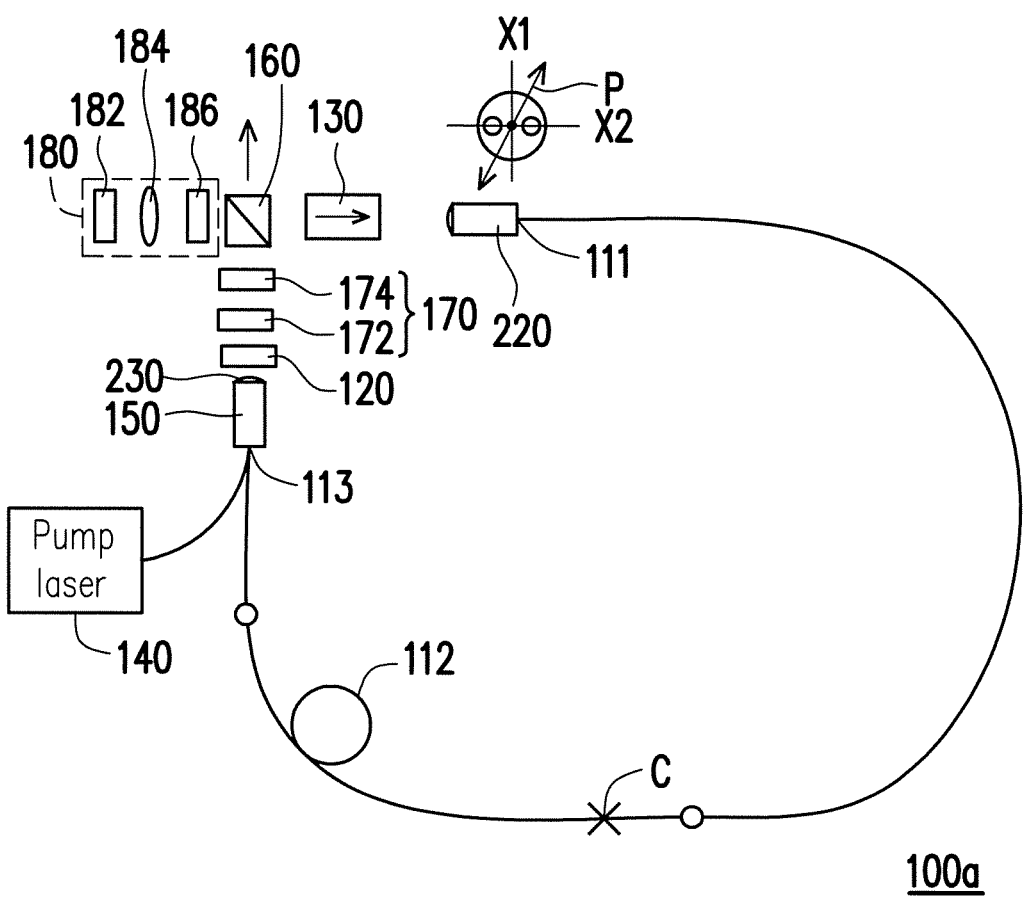
FIG. 4 is a schematic view of a pulse laser device according to another exemplary embodiment.

FIG. 4 is a schematic view of a pulse laser device according to another exemplary embodiment. Referring to FIG. 4 the pulse laser device 100a in this embodiment is similar to the pulse laser device 100 in FIG. 1, and the main difference is as follows. In this embodiment, the pulse laser device 100a further includes a linear section 180 disposed on the light path of the ring laser resonator, wherein the linear section 180 may include at least one of a reflecting element, a saturable absorber mirror, a Bragg grating, a dispersion compensator, and a grating pair. In this embodiment, the linear section 180 includes a semiconductor saturable absorber mirror (SESAM) 182, a lens 184, and a quarter waveplate 186 sequentially arranged along a line. The light reflected by the output coupling device 160 (i.e. the PBS) passes through the quarter waveplate 186 and is focused by the lens 184 onto the SESAM 182, and the light from the SESAM passes through the lens 184, the quarter waveplate 186, the output coupling device 160, and the optical isolator 130 in sequence. The SESAM 182 may help to start mode-locking. In other embodiments, the SESAM 182 may be replaced by graphene, carbon nanotubes, or any other type of saturable absorber.

Figure 5:
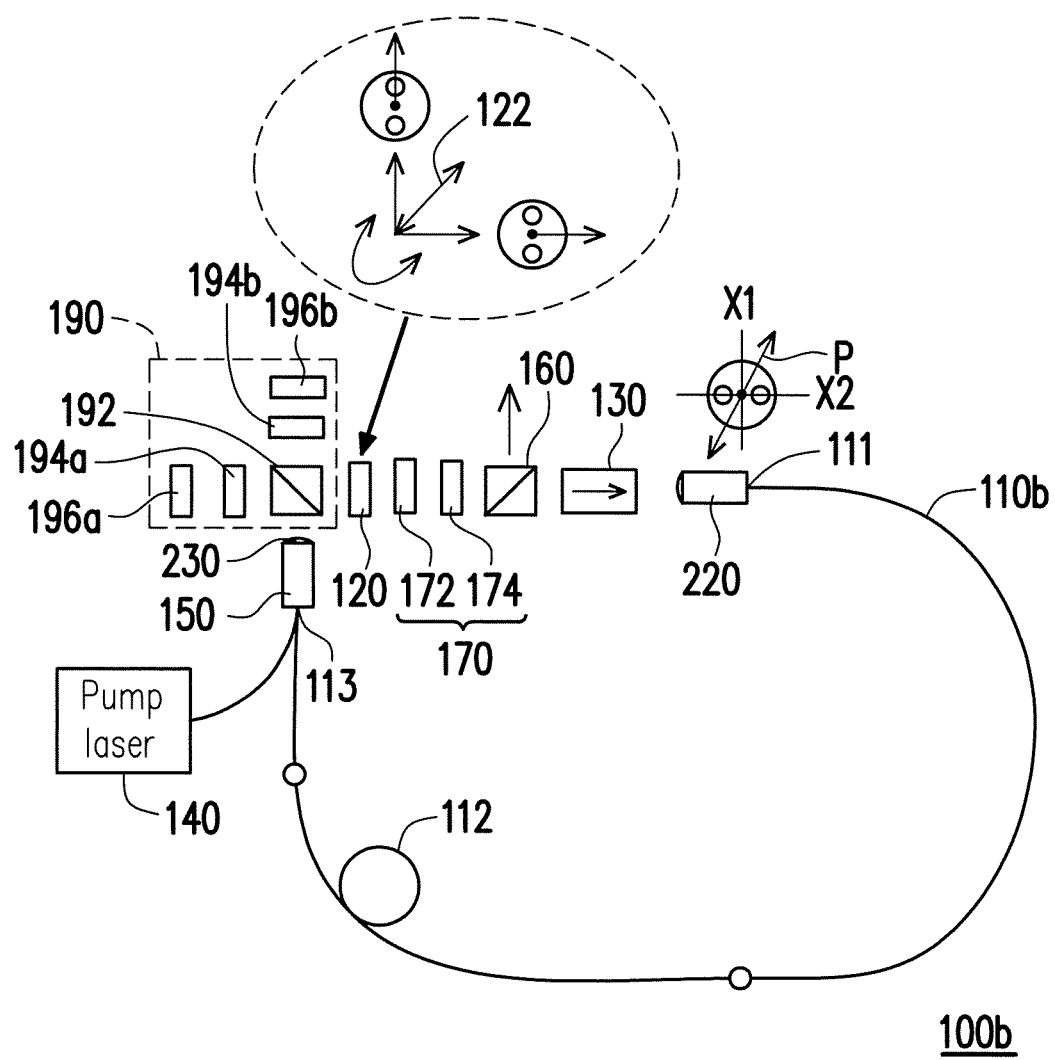
FIG. 5 is a schematic view of a pulse laser device according to another exemplary embodiment.

FIG. 5 is a schematic view of a pulse laser device according to another exemplary embodiment. Referring to FIG. 5, the pulse laser device 100b in this embodiment is similar to the pulse laser device 100 in FIG. 1, and the main difference is as follows. In the pulse laser device 100b in this embodiment, the PM fiber 110b may have no 90 degrees cross splicing position. Instead, the pulse laser device 100b has a delay tuner 190 configured to eliminate delay between the first linearly polarized light and the second linearly polarized light from or to the fast axis X1 and the slow axis X2 of the PM fiber 110b. In this embodiment, the delay tuner 190 is disposed at the light output end 113 of the PM fiber 110b and configured to eliminate the delay between the first linearly polarized light and the second linearly polarized light from the fast axis X1 and the slow axis X2 of the PM fiber 110b. However, in other embodiments, the delay tuner 190 may be disposed at the light input end 111 of the PM fiber 110b or at both the input end 111 and output end 113 of the PM fiber 110b and configured to eliminate the delay between the first linearly polarized light and the second linearly polarized light to the fast axis X and the slow axis X2 of the PM fiber 110b. In this embodiment, the PM fiber 110b, the optical isolator 130, the output coupling device 160, and the delay tuner 190 are on the light path of a ring laser resonator.

The delay tuner 190 includes a polarizing beam splitter (PBS) 192, quarter waveplates 194a and 194b, and mirrors 196a and 196b and is configured to separate and recombine the first linearly polarized light and the second linearly polarized light from or to the fast axis X1 and the slow axis X2 of the PM fiber 110b. In this embodiment, the first linearly polarized light may be reflected by the PBS 192, pass through the quarter waveplate 194a, be reflected by the mirror 196a, pass through the quarter waveplate 194a again, and pass through the PBS 192 in sequence, wherein after the first linearly polarized light passes through the quarter waveplate 194a twice, the polarization direction of the first linearly polarized light is rotated by 90 degrees, so that the first linearly polarized light can then pass through the PBS 192. The second linearly polarized light may pass through the PBS 192, pass through the quarter waveplate 194b, be reflected by the mirror 196b, pass through the quarter waveplate 194b again, and be reflected by the PBS 192 in sequence, wherein after the second linearly polarized light passes through the quarter waveplate 194b twice, the polarization direction of the second linearly polarized light is rotated by 90 degrees, so that the second linearly polarized light can then be reflected by the PBS 192. Then, the first linearly polarized light passing through the PBS 192 and the second linearly polarized light reflected by the PBS 192 are combined by the PBS 192. The distance between the mirror 196a and the PBS 192 may be adjusted to an appropriate value, or the distance between the mirror 196b and the PBS 192 may be adjusted to an appropriate value, so that the delay between the first linearly polarized light and the second linearly polarized light from the fast axis X1 and the slow axis X2 of the PM fiber 110b may be eliminated.

Moreover, the first quarter waveplate 120 is disposed on the light path of the ring laser resonator between the light output end 113 and the optical isolator 130 and configured to convert the first and the second linearly polarized lights into left-handed and right-handed (or right-handed and left-handed) circularly polarized lights, respectively. That is, the optical axis 122 of the first quarter waveplate 120 is tilted with respect to the s-polarization direction of the PBS 192 by 45 degrees. However, in other embodiments, the optical axis 122 of the first quarter waveplate 120 is tilted with respect to the s-polarization direction of the PBS 192 by an angle other than 45 degrees, and the half waveplate 172 may be rotated to an appropriate direction to achieve the NPR effect, wherein this half waveplate 172 may be disposed on the light path of the ring laser resonator before or after the first quarter waveplate 120 (FIG. 5 shows the half waveplate 172 disposed after the first quarter waveplate 120; however, in other embodiments, the half waveplate 172 may be disposed on the light path of the ring laser resonator between the light output end 113 and the first quarter waveplate 120).

Figure 6:
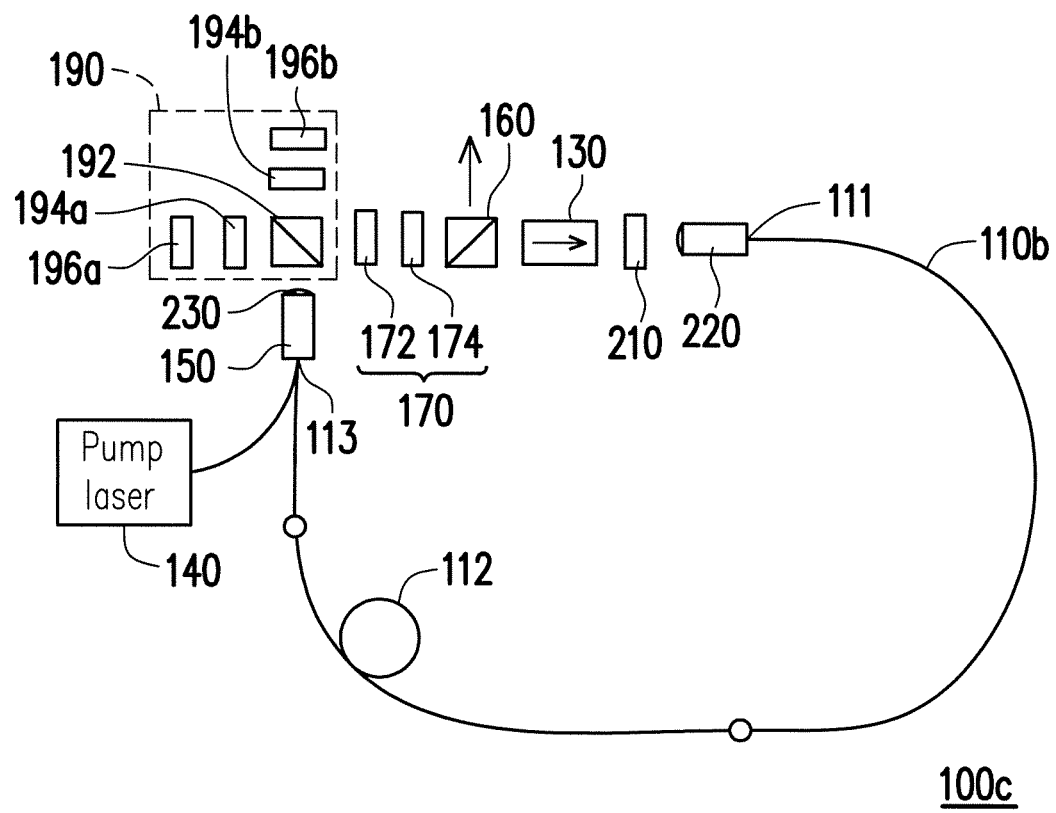
FIG. 6 is a schematic view of a pulse laser device according to another exemplary embodiment.

FIG. 6 is a schematic view of a pulse laser device according to another exemplary embodiment. Referring to FIG. 6, the pulse laser device 100c in this embodiment is similar to the pulse laser device 100b in FIG. 5, and the main difference is as follows. In this embodiment, the pulse laser device 100c does not have the first quarter plate 120 as shown in FIG. 5. Instead, the pulse laser device 100c includes a half or other retardation (i.e. the retardation different from half a wavelength) waveplate 210 disposed on the light path of the ring laser resonator and at the light input end of the PM fiber 110b to adjust the light field amplitude inputting to the two axes of the PM fiber. If the other retardation waveplate is disposed, the first phase of the first linearly polarized light at the light input end 111 is different from the second phase of the second linearly polarized light at the light input end 111. The optical axes of the half waveplate 172 and the second quarter waveplate 174 may be rotated to appropriate directions to allow high intensity light to pass through the output coupling device 160 (i.e. the PBS), and facilitate the generation of mode-locking.

Figure 7:
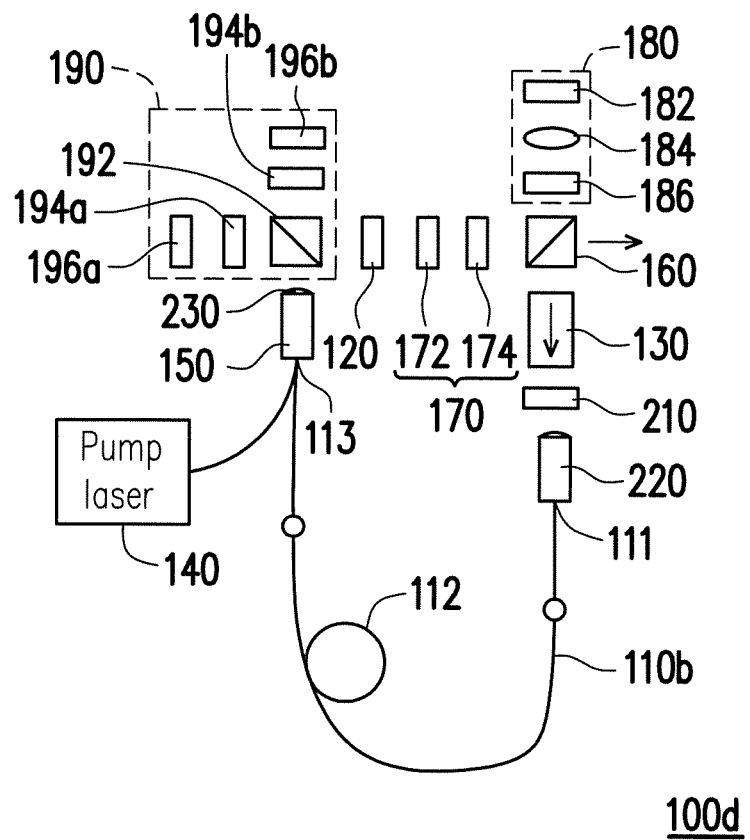
FIG. 7 is a schematic view of a pulse laser device according to another exemplary embodiment.

FIG. 7 is a schematic view of a pulse laser device according to another exemplary embodiment. Referring to FIG. 7, the pulse laser device 100d in this embodiment is similar to the pulse laser device 100b in FIG. 5, and the main difference is as follows. In this embodiment, pulse laser device 100d also includes a linear section 180 as shown in FIG. 4 on the light path of the ring laser resonator. Moreover, in this embodiment, the pulse laser device 100d also includes a half or other retardation waveplate 210 as shown in FIG. 6 and disposed at the light input end 111 of the PM fiber 110b.

In conclusion, the pulse laser device according to the exemplary embodiments is a mode-locked fiber ring laser with all PM fiber 110 based on nonlinear polarization rotation (NPR) mechanism. The laser field polarization ellipse is formed and rotates after the combination of the PM fiber and the first quarter waveplate, not along the fiber. The PM fiber maintains the polarizations of the two linearly polarized lights along the fast and slow axes of the PM fiber to reduce the effect of environmental variations, e.g. temperature and pressure variations. As a result, an environmental stable mode-locked fiber laser, i.e. the pulse laser device according to the exemplary embodiments, is achieved.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A pulse laser device with a ring laser resonator, the pulse laser device comprising:
   a polarization maintaining (PM) fiber having a light input end and a light output end and configured to guide a first linearly polarized light with a first phase along a fast axis of the PM fiber from the light input end and a second linearly polarized light with a second phase along a slow axis of the PM fiber from the input end;
   a first quarter waveplate disposed at the light output end of the PM fiber and configured to convert the first and the second linearly polarized lights into left-handed and right-handed (or right-handed and left-handed) circularly polarized lights, respectively; and
   an optical isolator configured to unidirectionally transmit a laser pulse in the ring laser resonator,
   wherein the PM fiber has at least one 90 degrees cross splicing position to eliminate delay between the first linearly polarized light and the second linearly polarized light, and wherein the PM fiber, the first quarter waveplate, and the optical isolator are on a light path of the ring laser resonator.

2. The pulse laser device according to claim 1, wherein the first phase is the same as the second phase.

3. The pulse laser device according to claim 1, wherein the first phase is different from the second phase.

4. The pulse laser device according to claim 1, wherein an amplitude of the first linearly polarized light is different from an amplitude of the second linearly polarized light.

5. The pulse laser device according to claim 1, wherein the first quarter waveplate has an optical axis tilted with respect to the fast axis and the slow axis of the PM fiber by 45 degrees.

6. The pulse laser device according to claim 1, wherein the PM fiber includes at least one of a section of Erbium, Ytterbium, or Thulium-doped fiber and a Raman or Brillouin gain medium.

7. The pulse laser device according to claim 6 further comprising a pump laser and a wavelength-division multiplexer, wherein the at least one of a section of Erbium, Ytterbium, or Thulium-doped fiber and a Raman or Brillouin gain medium is pumped by the pump laser through the wavelength-division multiplexer.

8. The pulse laser device according to claim 1 further comprising a polarization controlling device disposed on the light path of the ring laser resonator between the first quarter waveplate and the optical isolator.

9. The pulse laser device according to claim 8, wherein the polarization controlling device comprises a half waveplate, a second quarter waveplate, or a combination thereof.

10. The pulse laser device according to claim 1 further comprising an output coupling device disposed on the light path of the ring laser resonator.

11. The pulse laser device according to claim 10, wherein the output coupling device comprises at least one of a polarizing beam splitter and a fiber coupler.

12. The pulse laser device according to claim 1 further comprising a linear section disposed on the light path of the ring laser resonator, wherein the linear section comprises at least one of a reflecting element, a saturable absorber mirror, a Bragg grating, a dispersion compensator, and a grating pair.

13. The pulse laser device according to claim 1 further comprising at least one of a half waveplate and a waveplate having retardation different from half a wavelength, disposed on the light path of the ring laser resonator and at the light input end of the PM fiber.

* * * * *